(12) United States Patent
Lee et al.

(10) Patent No.: US 6,919,628 B2
(45) Date of Patent: Jul. 19, 2005

(54) STACK CHIP PACKAGE STRUCTURE

(75) Inventors: I-Tseng Lee, Taipei Hsien (TW); Hsueh Kuo Liao, Taipei Hsien (TW); Jen-Te Tseng, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/604,409

(22) Filed: Jul. 18, 2003

(65) Prior Publication Data

US 2004/0140546 A1 Jul. 22, 2004

(30) Foreign Application Priority Data

Jan. 22, 2003 (TW) ........................................ 92201153 U

(51) Int. Cl.$^7$ ............................................. H01L 23/02
(52) U.S. Cl. .................... 257/686; 257/687; 257/681
(58) Field of Search ................................. 257/686–691, 257/700–704, 706

(56) References Cited

U.S. PATENT DOCUMENTS

| | | | | |
|---|---|---|---|---|
| 4,636,275 A | * | 1/1987 | Norell | ........................ 156/289 |
| 6,423,643 B1 | * | 7/2002 | Furuhata et al. | ............. 438/694 |
| 6,469,380 B2 | * | 10/2002 | Sorimachi et al. | ........... 257/706 |
| 6,555,917 B1 | * | 4/2003 | Heo | ........................... 257/777 |
| 6,580,167 B1 | * | 6/2003 | Glenn et al. | ................. 257/718 |
| 6,737,755 B1 | * | 5/2004 | McLellan et al. | ............ 257/796 |
| 2002/0096754 A1 | * | 7/2002 | Chen et al. | ................... 257/686 |
| 2003/0127722 A1 | * | 7/2003 | Nakaoka et al. | ............. 257/686 |

* cited by examiner

*Primary Examiner*—Hoai Pham
*Assistant Examiner*—Nathan W. Ha
(74) *Attorney, Agent, or Firm*—Jianq Chyun IP office

(57) ABSTRACT

A stack chip package structure is provided. One principal feature of the structure is the formation of a few peripheral surfaces (e.g. ladder or lead-angle surfaces) at the bottom peripheral sections of a stack structure. When the stack structure is attached to a surface of a die through an adhesive layer, the thickness of the adhesive layer under a peripheral section of the stack structure is greater than a central region. Therefore, as the chip package is subjected to a thermal stress test, the adhesive layer under the peripheral sections of the stack structure is able to provide some buffering against thermal stress so that the stress concentration around the stack structure is reduced. Consequently, damages of the die surface due to stress are prevented and the average working life of the chip package is extended.

15 Claims, 5 Drawing Sheets

STACK CHIP PACKAGE STRUCTURE

CROSS REFERENCE TO RELATED APPLICATIONS

This application claims the priority benefit of Taiwan application serial no. 92201153, filed on Jan. 22, 2003.

BACKGROUND OF INVENTION

1. Field of Invention

The present invention relates to a chip package structure. More particularly, the present invention relates to a stack chip package structure.

2. Description of Related Art

As techniques for fabricating a smaller integrated circuit (IC) progresses, the level of integration inside an IC chip also increases. Moreover, the number of transistors inside the IC chip increases and the cross-sectional area of internal conductive lines are reduced. In general, heat is produced in each transistor and conductive line. Hence, a compact IC chip will produce a lot of heat during operation leading to an increase in temperature. As temperature of the IC chip rises to a level above the normal operating temperature, computational errors, temporary malfunction or permanent damages may occur. Therefore, aside from providing suitable output signals via an interface, the IC chip must be physically protected and have good heat dissipation capacity so that the IC is maintained at a suitable operating temperature, and be prevented from exceeding the normal operating temperature range.

For most wire-bonding type of chip packages, a dummy die or a heat conductive metal block is stacked on top of a functional die to serve as a thermal conductive block. In this manner, the thermal impedance along the conductive path of the functional die is lowered. As a result, the heat generated by the chip is rapidly transferred to the outer surface of the chip package and dissipated away to the surrounding air.

FIG. 1 is a schematic cross-sectional view of a conventional stack chip package structure. The package in FIG. 1 has a wire bonding (W/B) chip package structure 100. The chip package structure 100 mainly comprises a carrier 110, a die 120, a thermal conductive block 130, an adhesive layer 140, a plurality of conductive wires 150 and a molding compound 160. The carrier 110 is, for example, a substrate or a lead frame (here, the carrier 110 is a substrate). The carrier 110 has a carrier surface 112 and a plurality of bonding pads 114. The bonding pads 114 are positioned on the carrier surface 112 of the carrier 110. In addition, the die 120 has an active surface 122 and a back surface 124. The back surface 124 of the die 120 is attached to the carrier surface 112 of the carrier 110 via the adhesive layer 142. The die 120 has a plurality of metal pads 126 on the active surface 122. The thermal conductive block 130 is, for example, a dummy die or a metallic block with high thermal conductivity. The thermal conductive block 130 has a bonding surface 132 that attaches to the active surface 122 of the die 120 through another adhesive layer 140. The metallic wires 150 connect each metal pad 126 on the die 120 with a corresponding bonding pad 114 on the carrier 110 electrically. The molding compound 160 encloses the die 120, the thermal conductive block 130 and the conductive wires 150.

As shown in FIG. 1, the thermal conductive block 130 has a rectangular structure, for example. In other words, the bonding surface 132 (or the bottom surface) and a side surface 134 of the thermal conductive block 130 form a right angle (the bonding surface 132 and the side surface 134 form a 90° angle). This often leads to a problem of concentrating stress at the bottom peripheral sections of the thermal conductive block 130. When the chip package 100 is subjected to a thermal stress testing, for example, a temperature cycle test (TCT) or a thermal shock test (TST), repeated heat expansion and cool contraction bends the thermal conductive block 130 and results a stress ring at its bottom peripheral sections that is particularly hard. As a result, a passivation layer (not shown) that covers the actives surface 122 of the die 120 may crack and damage some of the underlying wiring circuits (not shown).

In order to increase the elastic buffer between the die 120 and the thermal conductive block 130, the thickness of the adhesive layer 140 may be increased. However, the thermal impedance of the adhesive material is much greater than the thermal impedance of the thermal conductive block material. Hence, the overall thermal impedance of the die 120 is increased if thickness of the adhesive layer 140 is increased. Therefore, to meet the thermal requirement of a particular package, there must be a maximal limitation for the thickness of the adhesive layer 140. Yet, the adhesive layer 140 may not be too thick to buffer the passivation layer over the die 120 against repetitive stress.

SUMMARY OF INVENTION

Accordingly, one object of the present invention is to provide a stack chip package structure with a die and a thermal conductive block therein such that stress concentration at the bottom peripheral sections of the thermal conductive block is reduced. Hence, the surface of the die surface is subjected to a lower stress and the overall working life of the chip package is increased.

To achieve these and other advantages and in accordance with the purpose of the invention, as embodied and broadly described herein, the invention provides a stack chip package structure. The stack chip package at least includes a carrier, a die, an adhesive layer, and a stack structure wherein the die is electrically connected with the carrier. The die has a first surface and a second surface. The second surface of the die is corresponding to a carrier surface. The adhesive layer is disposed on the first surface of the die. The stack structure has a bonding surface. The bonding surface of the stack structure is attached to the first surface of the die via the adhesive layer. The bonding surface further includes a central surface and at least one peripheral surface. The peripheral surface surrounds the central surface and is further away from the first surface of the die than the central surface relatively. Therefore, the adhesive layer between one of the peripheral surfaces and the first surface is thicker than the adhesive layer between the central surface and the first surface.

In brief, one major aspect of this invention is the production of at least one peripheral surface at the bottom peripheral sections of a stack structure. Hence, total amount of adhesive at the bottom peripheral sections of the stack structure is increased. When the chip package is subjected to a thermal testing, the adhesive layer at the bottom section of the stack structure is able to provide some elastic buffering so that stress at the bottom peripheral sections of the stack structure is reduced considerably. Consequently, damages to the die surface due to repeated thermal stress are prevented. Ultimately, the working life of the chip package is extended.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
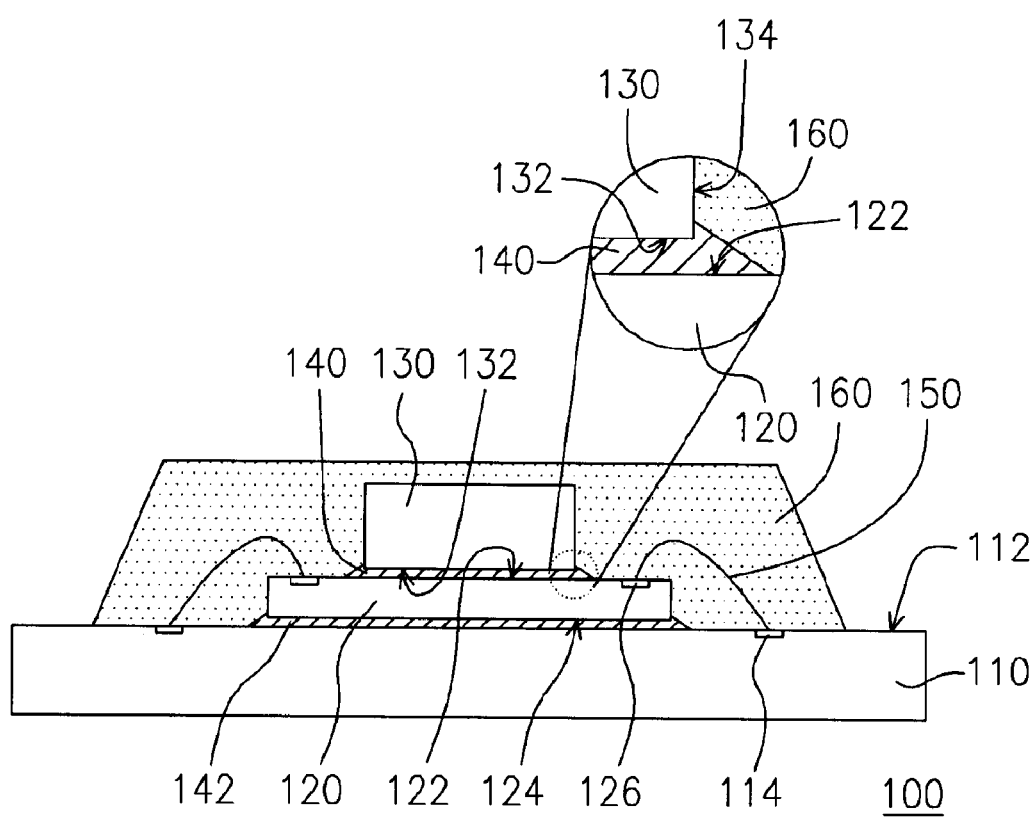
FIG. 1 is a schematic cross-sectional view of a conventional stack chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
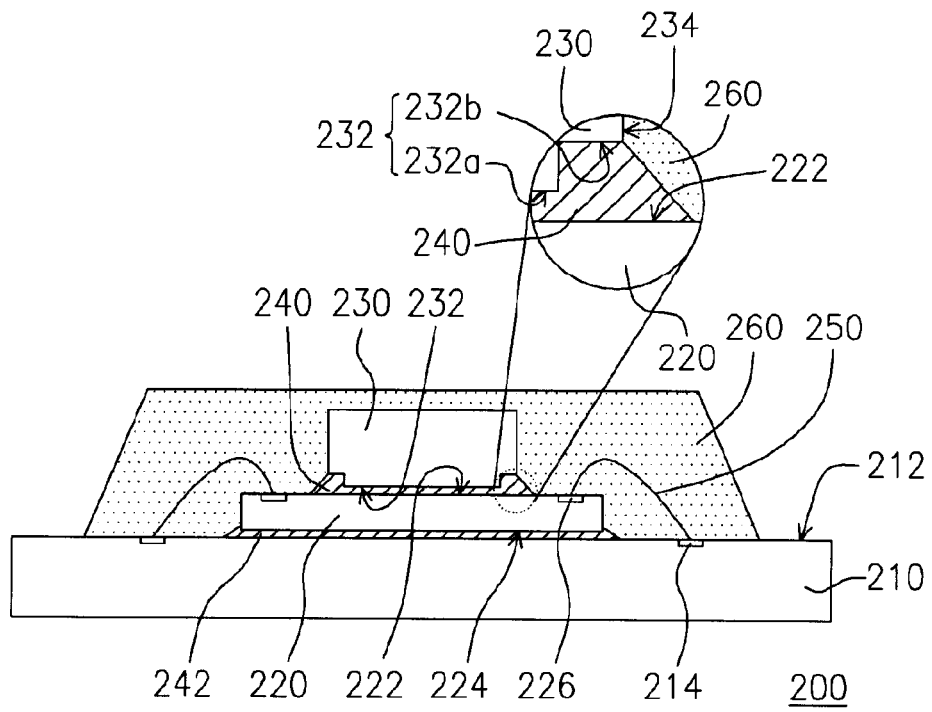
FIG. 2A is a schematic cross-sectional view of a stack chip package structure according to a first preferred embodiment of this invention.

FIG. 2A is a schematic cross-sectional view of a stack chip package structure according to a first preferred embodiment of this invention, wherein the peripheral surfaces of the thermal conductive block are single ladder surfaces. As shown in FIG. 2A, the chip package structure 200 mainly includes a carrier 210, a die 220, a thermal conductive block 230, a adhesive layer 240, a plurality of conductive wires 250 and a molding compound 260. The carrier 210 is, for example, a substrate or a lead frame (here, the carrier 210 is a substrate). The carrier 210 has a carrier surface 212 and a plurality of bonding pads 214 thereon. The die 220 has an active surface 222 and a back surface 224. The back surface 224 of the die 220 is attached to the carrier surface 212 of the carrier 210 through an adhesive layer 242. The die 220 has a plurality of metal pads 226 on the active surface 222. The thermal conductive block 230 is, for example, a dummy die, a thermally conductive metallic block or a graphite block. The thermal conductive block 230 has a bonding surface 232. The bonding surface 232 of the thermal conductive block 230 is attached to the active surface of the die 220 through the adhesive layer 240. The adhesive layer 240 is fabricated using a material including epoxy resin, for example. The conductive wires 250 connect each metal pad to a corresponding bonding pad 214 electrically. The molding compound 260 encloses the die 220, the thermal conductive block 230 and the conductive wires 250.

As shown in FIG. 2A, the bonding surface 232 of the thermal conductive block 230 further includes a central surface 232a and a plurality of peripheral surfaces 232b (in a magnified view of FIG. 2A). Note that the peripheral surfaces 232b surround the central surface 232a in a direction away from the active surface 222 of the die 220. The peripheral surfaces 232b and the central surface 232a are non-coplanar. Furthermore, the plurality of side surfaces 234 of the thermal conductive block 230 is indirectly connected to the central surface 232a via the peripheral surfaces 232b. Hence, the peripheral surface 232b is at a height level greater than the central surface 232a relative to the active surface 222. In other words, the peripheral surface 232b is further away from the active surface 222 when compared with the central surface 232a.

After attaching the bonding surface 232 of the thermal conductive block 230 to the active surface 222, the thickness of the adhesive layer 240 between the peripheral surface 232b and the active surface 222 is greater than the adhesive layer 240 between the central surface 232a and the active surface 222. Thus, thickness of the adhesive layer 240 at the bottom peripheral sections of the thermal conductive block 230 is increased. When the chip package structure 200 is subjected to a thermal stress test that includes cycles of expansion/contraction and bending, the adhesive layer 240 sandwiched between the peripheral surface 232b and the active surface 222 of the die 220 serves as an elastic buffer. In this way, stress concentration level at the bottom peripheral sections of the thermal conductive block 230 is lowered and damages of the die surface 222 due to stress are minimized.

Figure 2B:
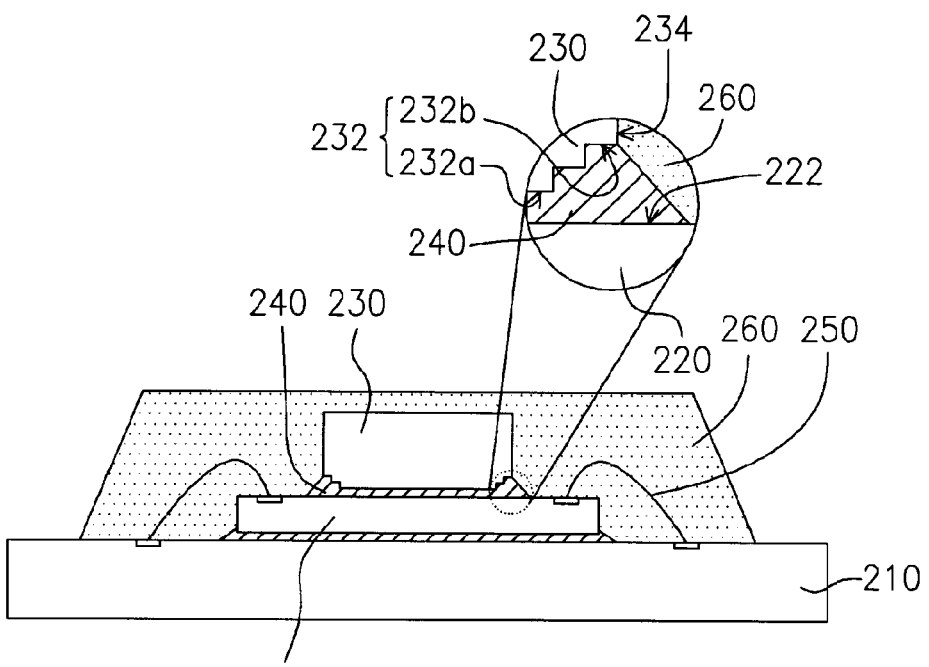
FIG. 2B is a schematic cross-sectional view of the chip package structure in FIG. 2A with a peripheral surface on the thermal conductive block, wherein the peripheral surfaces of the thermal conductive block are multi-step ladder surfaces.
Figure 2C:
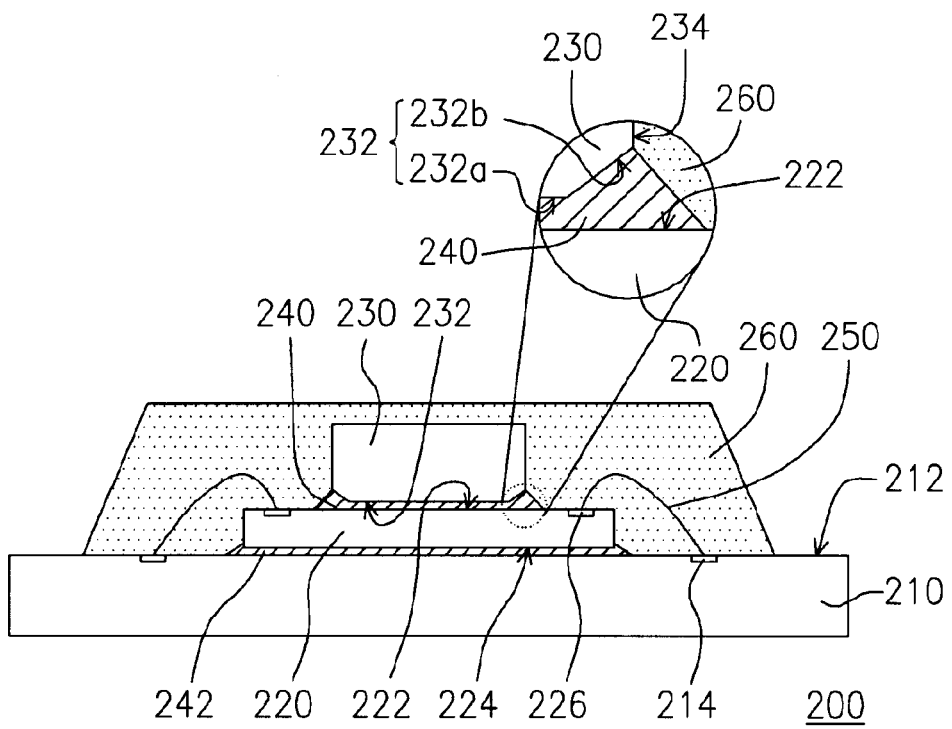
FIG. 2C is a schematic cross-sectional view of the chip package structure in FIG. 2A with a peripheral surface on the thermal conductive block, wherein the peripheral surfaces of the thermal conductive block are sloping surfaces.
Figure 2D:
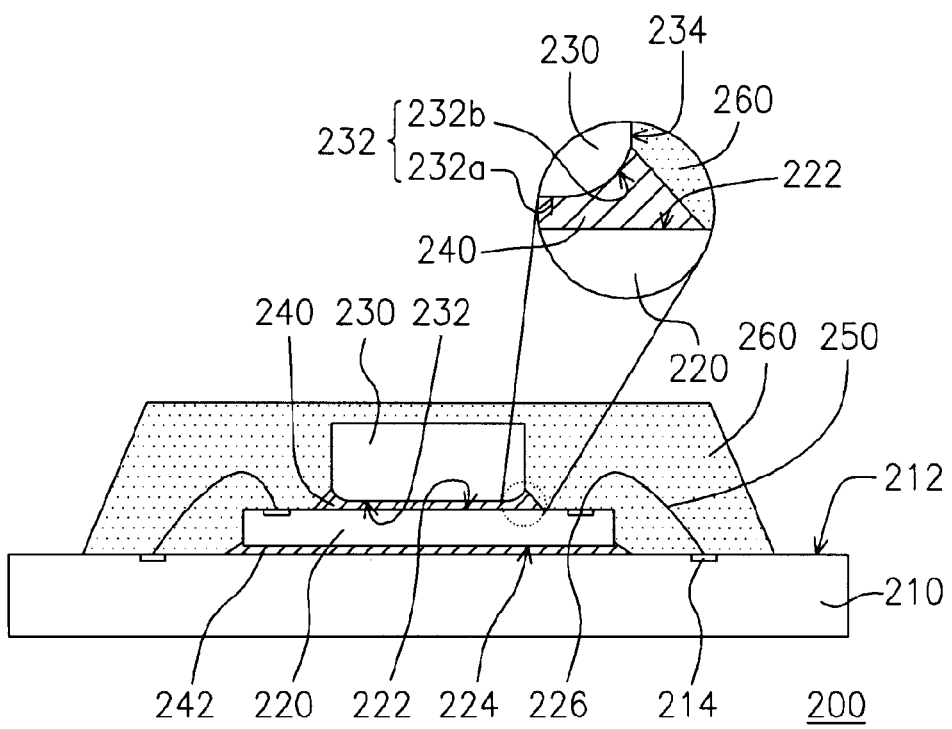
FIG. 2D is a schematic cross-sectional view of the chip package structure in FIG. 2A with a peripheral surface on the thermal conductive block, wherein the peripheral surfaces of the thermal conductive block are curved surfaces.

FIG. 2B is a schematic cross-sectional view of the chip package structure in FIG. 2A with a peripheral surface on the thermal conductive block, wherein the peripheral surfaces of the thermal conductive block are multi-step ladder surfaces. FIG. 2C is a schematic cross-sectional view of the chip package structure in FIG. 2A with a peripheral surface on the thermal conductive block, wherein the peripheral surfaces of the thermal conductive block are sloping surfaces. FIG. 2D is a schematic cross-sectional view of the chip package structure in FIG. 2A with a peripheral surface on the thermal conductive block, wherein the peripheral surfaces of the thermal conductive block are curved surfaces. Aside from a single step in FIG. 2A, the peripheral surface 232b can be a ladder with multiple steps as shown in FIG. 2B. Further, the peripheral surface 232b also can be a sloping or a curved surface as shown in FIG. 2C and FIG. 2D. Therefore, the peripheral surface 232b is similarly capable of reducing the degree of stress concentration at the bottom peripheral sections of the thermal conductive block 230.

Figure 3:
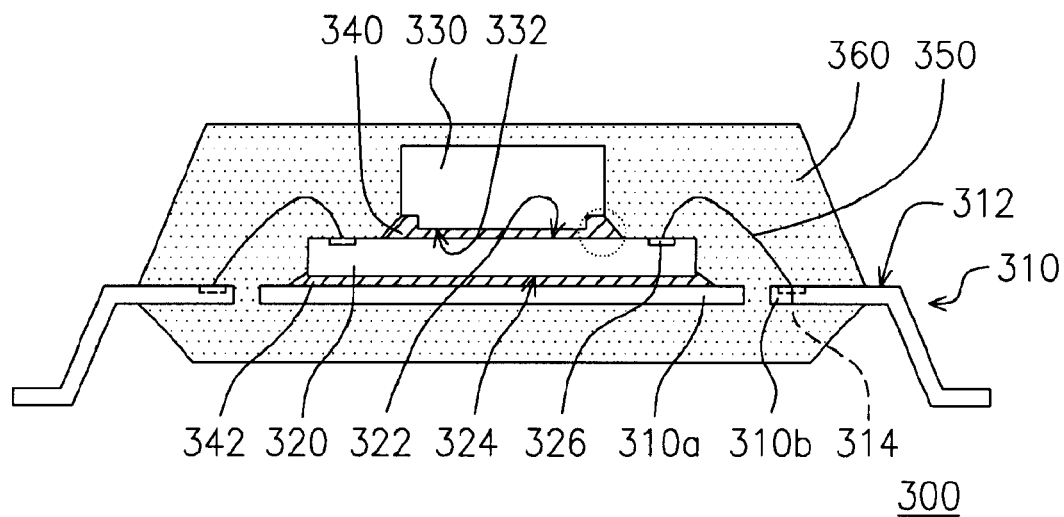
FIG. 3 is a schematic cross-sectional view of a stack chip package structure according to a second preferred embodiment of this invention.

FIG. 3 is a schematic cross-sectional view of a stack chip package structure according to a second preferred embodiment of this invention. One major difference from the package in FIG. 2A is that the chip package in FIG. 3 uses a leadframe instead of a substrate as a carrier 310. With a lead-frame carrier 310, the carrier 310 has a die pad 310a and a plurality of leads 310b. A die 320 and a thermal conductive block 330 are sequentially stacked over the die pad 310a. One end of the leads 310b provides a bonding pad 314 for attaching a conductive wire 350 during a wire bonding process. Conductive wires 350 connect a metal pad 326 on the die 320 with the bonding pads 314 on the leads 310. The molding compound 360 encloses the die 320, the thermal conductive block 330, the conductive wires 360 and a portion of the carrier 310 (the die pad 310 and a portion of the leads 310b). Note that the bonding surface 332 of the thermal conductive block 330 is identical to the bonding surface 232 in FIG. 2A. Both designs include a central surface (232a) and a plurality of peripheral surfaces (232b).

Figure 4:
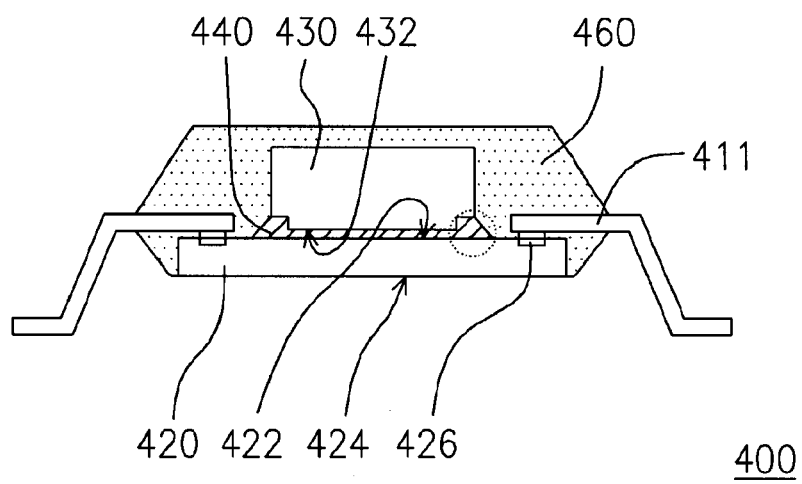
FIG. 4 is a schematic cross-sectional view of a stack chip package structure according to a third preferred embodiment of this invention.

FIG. 4 is a schematic cross-sectional view of a stack chip package structure according to a third preferred embodiment of this invention. One major difference from the package in FIG. 2A is that the chip package 400 in FIG. 4 is a type of lead on chip (LOC) package that has no carrier. As shown in FIG. 4, instead of connecting through conductive wires 350 in FIG. 3, one end of each lead 411 is directly in contact with a corresponding metal pad 426 on the active surface 422 of the die 420. The bonding surface 432 of the thermal conductive block 430 is similarly attached to the active surface 422 of the die 420 through an adhesive layer 440. In addition, a molding compound 460 encloses a portion of the die 420, the thermal conductive block 430 and a portion of the leads 411. Furthermore, the molding compound 460 may expose the back surface 424 of the die 420. Note that the bonding surface 432 of the thermal conductive block 430 has an identical design to the bonding surface 232 shown in FIG. 2A. Both designs include a central surface (232a) and a plurality of peripheral surfaces (232b).

Figure 5:
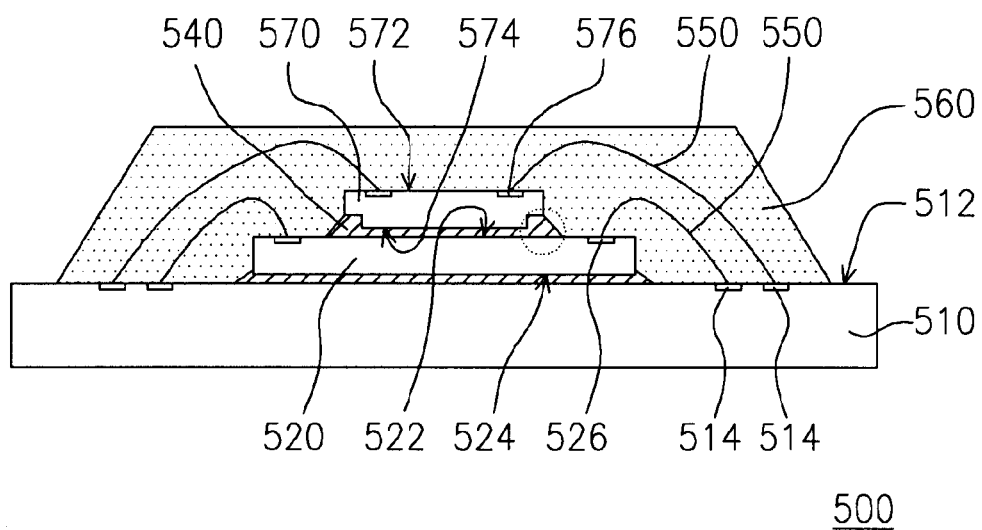
FIG. 5 is a schematic cross-sectional view of a stack chip package structure according to a fourth preferred embodiment of this invention.

To form a system in package (SIP) module, a plurality of functional dies may stack over a carrier. FIG. 5 is a schematic cross-sectional view of a stack chip package structure according to a fourth preferred embodiment of this invention. As shown in FIG. 5, the chip package structure 500 mainly comprises a carrier 510, a first (functional) die 520, a second (functional) die 570, a adhesive layer 540, a plurality of conductive wires 550 and a molding compound 560. The chip package structure 500 uses a functional die 570 instead of a thermal conductive block (230). Metal pads 576 on the active surface 572 of the die 570 are electrically connected to respective bonding pads 514 on the carrier surface 512 of the carrier 510 using conductive wires 550. Note that the back surface 574 of the die 570 has a configuration identical to the bonding surface 232 of the thermal conductive block 230 in FIG. 2A. Hence, the back surface 574 of the die 570 is attached to the active surface 522 of the die 520 through the adhesive layer 540. With this arrangement, thickness of the adhesive layer 540 at the bottom peripheral sections of the die 570 is greater than the one at the bottom central region of the die 570. The molding compound 560 encloses the first die 520, the second die 570, and the conductive wires 550.

Figure 6:
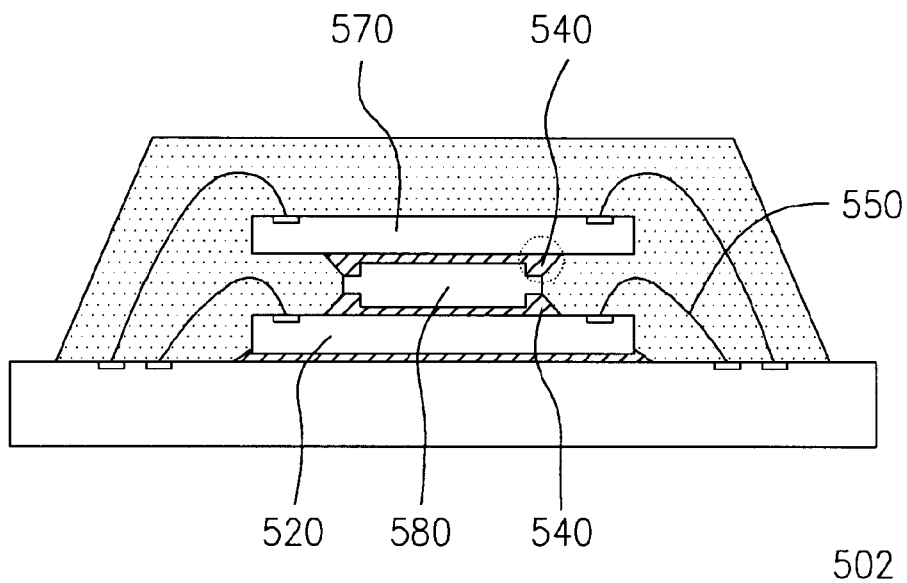
FIG. 6 is a schematic cross-sectional view of the chip package structure in FIG. 5 with a padding block inserted between two dies.

FIG. 6 is a schematic cross-sectional view of the chip package structure in FIG. 5 with a padding block inserted between two dies. The chip package structure 502 in FIG. 6 has a padding block 580 inserted into the space between the lower die 520 and the upper die 570 to prevent direct contact or short-circuit of conductive wires 550 with the back surface of the upper die 570. Note that the padding block 580 has peripheral surfaces at both the upper peripheral sections and lower peripheral sections so that the adhesive layer 540 in there is thicker than in the central region. The non-uniformity of the adhesive layer 540 provides some elastic buffering against thermal stress. In addition, the padding block 580 can be a dummy die, a metal block, a graphite block or some other material block.

Furthermore, each stack chip package according to this invention may include a stack of stack structures (for example, functional dies, dummy dies, metal blocks, graphite blocks or padding blocks). A plurality of peripheral surfaces (e.g. ladder, sloping or curved surfaces) that may be shaped at the bottom peripheral sections of one of the pair of neighboring stack structures so that the adhesive layer is thicker around the bottom peripheral sections than the central region to buffer against thermal stress.

In summary, this invention provides a stack chip package structure with a thicker adhesive layer around the edges than the central area of a die. In this manner thicker adhesive layer can be set near the edges of a stack element (for example, a dummy die, a metal block, a graphite block or a functional die) simply by machining away a portion of the material from the edges to form a plurality of peripheral surfaces (e.g. ladder, sloping or curved surfaces). Hence, the design is able to increase thickness of the adhesive layer in the edge region without thickening the adhesive layer elsewhere. When the chip package is subjected to a thermal testing, the adhesive layer at the bottom section of the stack structure is able to provide some buffering so that stress concentration level at the bottom peripheral sections of the stack structure is greatly reduced. Consequently, damages of the die surface (especially the active surface) due to repeated thermal stress are prevented and the working life of the chip package is increased expectedly.

Moreover, aside from a stack chip package structure with wire-bond (W/B) electrical connection, this invention can be applied to a package with a lead on chip (LOC) or a system in package (SIP) design as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stack chip package structure, comprising:
   a carrier with a carrier surface and a plurality of bonding pads, wherein the bonding pads are set up on the carrier surface;
   a die with an active surface and a back surface, wherein the back surface of the die is in contact with the carrier surface of the carrier and the active surface of the die has a plurality of metal pads thereon;
   an adhesive layer on the active surface of the die;
   a thermal conductive block with a bonding surface for attaching to the active surface of the die through the adhesive layer, wherein the bonding surface includes a central surface and a plurality of peripheral surfaces surrounding the central surface, wherein the adhesive layer between at least one of the peripheral surfaces and the active surface of the die is thicker than the adhesive layer between the central surface and the active surface, wherein the peripheral surfaces are multi-step ladder, curved or sloped surfaces;
   a plurality of conductive wires electrically connecting each metal pad to a corresponding bonding pad; and
   a molding compound enclosing the die, the thermal conductive block and the conductive wires.

2. The stack chip package structure of claim 1, wherein the carrier is a substrate or a lead-frame.

3. The carrier is a lead-frame in claim 2 including:
   a die pad for stacking over sequentially a die and a thermal conductive block; and
   a plurality of leads having a bonding pad on one end of the leads for attaching a conductive wire.

4. The stack chip package structure of claim 1, wherein the thermal conductive block is a dummy die, a metal block or a graphite block.

5. A stack chip package structure, comprising:
   a die with an active surface, wherein the active surface has a plurality of metal pads thereon;
   an adhesive layer on the active surface of the die;
   a thermal conductive block with a bonding surface for attaching to the active surface of the die through the adhesive layer, wherein the bonding surface further includes a central surface and a plurality of peripheral surfaces surrounding the central surface, and the adhesive layer is between the central surface and the active surface of the die and is between at least one of the peripheral surfaces and the active surface of the die, wherein the peripheral surfaces are further away from the active surface of the die than the central surface relatively, and the peripheral surfaces and the central surface are on non-coplanar planes and wherein the peripheral surfaces are multi-step ladder, sloped or curved surfaces;
   a plurality of leads, wherein each end of the lead is connected to a corresponding metal pad; and
   a molding compound for enclosing a portion of the die, the thermal conductive block and a portion of the leads.

6. The stack chip package structure of claim 5, wherein the molding compound exposes the back surface of the die.

7. The stack chip package structure of claim 5, wherein a thickness of the adhesive layer between the peripheral surface and the active surface is greater than that of the adhesive layer between the central surface and the active surface.

8. The stack chip package structure of claim 5, wherein the thermal conductive block is a dummy die, a metal block or a graphite block.

9. A stack chip package structure, comprising:
   a die with a first surface;
   an adhesive layer on the first surface of the die; and
   a stack structure with a bonding surface for attaching to the first surface of the die, wherein the bonding surface further includes a central surface and a plurality of peripheral surfaces surrounding the central surface and the adhesive layer is between the central surface and the first surface of the die and is between at least one of the peripheral surfaces of the stack structure and the first surface of the die, wherein the peripheral surfaces are further away from the active surface of the die than the central surface relatively, and the peripheral surfaces and the central surface are on non-coplanar planes, and the peripheral surfaces are multi-step ladder, sloped or curved surfaces.

10. The stack chip package structure of claim 9, wherein a thickness of the adhesive layer between the peripheral surface and the active surface of the die is greater than the adhesive layer between the central surface and the active surface of the die.

11. The stack chip package structure of claim 9, wherein the stack structure includes a dummy die.

12. The stack chip package structure of claim 9, wherein the stack structure includes a thermal conductive block.

13. The stack chip package structure of claim 9, wherein the stack structure includes a functional die.

14. The stack chip package structure of claim 9, wherein the first surface of the die has a plurality of metal pads and the stack chip package structure further includes:
   a carrier with a carrier surface and a plurality of bonding pads, wherein the bonding pads are set up on the carrier surface and a second surface of the die is attached to the carrier surface of the carrier;
   a plurality of conductive wires for connecting each metal pad with a corresponding bonding pad electrically; and
   a molding compound for enclosing the die, the stack structure and the conductive wires.

15. The stack chip package structure of claim 14, wherein the carrier is a substrate or a lead-frame.

* * * * *